(12) United States Patent
Lee et al.

(10) Patent No.: US 12,200,882 B2
(45) Date of Patent: Jan. 14, 2025

(54) DISPLAY DEVICE

(71) Applicant: LG Display Co., Ltd., Seoul (KR)

(72) Inventors: SeungHee Lee, Goyang-si (KR); Hyosung Lee, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 262 days.

(21) Appl. No.: 17/977,868

(22) Filed: Oct. 31, 2022

(65) Prior Publication Data

US 2023/0217610 A1 Jul. 6, 2023

(30) Foreign Application Priority Data

Dec. 30, 2021 (KR) .......................... 10-2021-0193484

(51) Int. Cl.
*H05K 5/02* (2006.01)

(52) U.S. Cl.
CPC .................................. *H05K 5/0217* (2013.01)

(58) Field of Classification Search
None
See application file for complete search history.

(56) References Cited

U.S. PATENT DOCUMENTS

| | | | |
|---|---|---|---|
| 10,045,448 B2 | 8/2018 | Yang | |
| 10,564,676 B2 * | 2/2020 | Kwon | ........................ H04N 5/64 |
| 10,671,124 B2 | 6/2020 | Kim et al. | |
| 10,701,821 B2 | 6/2020 | Kim et al. | |
| 10,877,525 B2 | 12/2020 | Kang et al. | |
| 11,140,974 B1 | 10/2021 | Ran | |
| 11,526,198 B1 * | 12/2022 | Kanas | .................... G06F 1/1624 |
| 11,553,610 B2 | 1/2023 | Lee et al. | |
| 11,785,726 B2 | 10/2023 | Han et al. | |
| 2007/0241002 A1 | 10/2007 | Wu et al. | |
| 2013/0021762 A1 * | 1/2013 | van Dijk | ............... G06F 1/1681 |
| | | | 361/749 |
| 2016/0324021 A1 | 11/2016 | Takayanagi et al. | |
| 2016/0363960 A1 | 12/2016 | Park et al. | |
| 2017/0013735 A1 | 1/2017 | Choi et al. | |
| 2017/0103735 A1 | 4/2017 | Oh et al. | |
| 2017/0156219 A1 | 6/2017 | Heo et al. | |
| 2017/0344073 A1 | 11/2017 | Kang et al. | |
| 2017/0359911 A1 | 12/2017 | Hayk et al. | |
| 2018/0110137 A1 | 4/2018 | Kim et al. | |
| 2018/0114471 A1 | 4/2018 | Park et al. | |
| 2018/0125228 A1 | 5/2018 | Porter et al. | |
| 2019/0246512 A1 | 8/2019 | Heo et al. | |
| 2019/0324502 A1 | 10/2019 | Chang et al. | |
| 2020/0100371 A1 | 3/2020 | Choi | |
| 2021/0337684 A1 * | 10/2021 | Pyo | ........................... G06F 1/16 |

(Continued)

FOREIGN PATENT DOCUMENTS

| | | |
|---|---|---|
| CN | 106340254 A | 1/2017 |
| CN | 106981254 A | 7/2017 |

(Continued)

*Primary Examiner* — Xanthia C Relford
(74) *Attorney, Agent, or Firm* — Seed IP Law Group LLP

(57) ABSTRACT

A display device includes a display panel in which an image is displayed; a tape spring which is connected to the display panel to lift the display panel; a first roller on which the display panel is wound or unwound; a second roller on which the tape spring is wound or unwound; and a timing belt which rotates the second roller in the same direction as the first roller when the first roller is wound or unwound.

20 Claims, 14 Drawing Sheets

(56) References Cited

U.S. PATENT DOCUMENTS

| | | | |
|---|---|---|---|
| 2021/0375165 A1* | 12/2021 | Feng | G09F 9/301 |
| 2021/0397219 A1 | 12/2021 | Ku et al. | |
| 2023/0004189 A1 | 1/2023 | Luo et al. | |
| 2023/0345655 A1* | 10/2023 | Sano | G06F 1/1624 |

FOREIGN PATENT DOCUMENTS

| | | |
|---|---|---|
| CN | 107452282 A | 12/2017 |
| CN | 109859635 A | 6/2019 |
| CN | 109996019 A | 7/2019 |
| CN | 110010002 A | 7/2019 |
| CN | 107408358 B | 6/2020 |
| CN | 111510538 A | 8/2020 |
| CN | 212782502 U | 3/2021 |
| CN | 112712759 A | 4/2021 |
| CN | 112874120 A | 6/2021 |
| CN | 113077719 A | 7/2021 |
| CN | 113433786 A | 9/2021 |
| EP | 3 115 988 A1 | 1/2017 |
| EP | 3300059 A1 | 3/2018 |
| GB | 2508194 A | 5/2014 |
| JP | H04166370 A | 6/1992 |
| JP | 2006299897 A | 11/2006 |
| JP | 2008530611 A | 8/2008 |
| JP | 2017536573 A | 12/2017 |
| JP | 2019028461 A | 2/2019 |
| JP | 2021525400 A | 9/2021 |
| KR | 10-2015-0005890 A | 1/2015 |
| KR | 20160059372 A | 5/2016 |
| KR | 20170006013 A | 1/2017 |
| KR | 10-2017-0136060 A | 12/2017 |
| KR | 20170136951 A | 12/2017 |
| KR | 10-2018-0045980 A | 5/2018 |
| KR | 20210126851 A | 10/2021 |
| WO | 2020/256183 A1 | 12/2020 |
| WO | 2021/058899 A1 | 4/2021 |

\* cited by examiner

DISPLAY DEVICE

CROSS-REFERENCE TO RELATED APPLICATIONS

This application claims the priority of Korean Patent Application No. 10-2021-0193484 filed on Dec. 30, 2021 in the Korean Intellectual Property Office, the entire disclosure of which is incorporated herein by reference.

BACKGROUND

Technical Field

The present disclosure relates to a display device, and more particularly, to a rollable display device which is capable of displaying images even in a rolled state.

Description of the Related Art

Display devices which are used for a monitor of a computer, a television, or a cellular phone include an organic light emitting display device (OLED) which is a self-emitting device and a liquid crystal display device (LCD) which utilizes a separate light source.

An applicable range of the display device is diversified to personal digital assistants as well as monitors of computers and televisions, and display devices with a large display area and a reduced volume and weight are being studied.

Further, recently, a rollable display device which is manufactured by forming a display unit and a wiring line on a flexible substrate such as plastic so as to be capable of displaying images even though the display device is rolled is getting attention as a next generation display device.

BRIEF SUMMARY

In one or more embodiments of the present disclosure, a display device is provided that constantly maintains a tension of a spring member which is applied to the display panel while winding and unwinding the display device.

In one or more embodiments of the present disclosure, a display is provided with a design structure which is capable of applying the same mechanism to an inner type display device and an outer type display device.

According to one or more embodiments of the present disclosure, a display device includes a display panel in which an image is displayed; a tape spring which is connected to the display panel to lift the display panel; a first roller on which the display panel is wound or unwound; a second roller on which the tape spring is wound or unwound; and a timing belt which rotates the second roller in the same direction as the first roller when the first roller is wound or unwound.

According to one or more embodiments of the present disclosure, when the display device is unwound, a torque of the spring member is concentrated so that excessive tension generated in the display panel may be minimized.

According to one or more embodiments the present disclosure, a first roller and a second roller which are disposed on different shafts are synchronized to apply the same mechanism to both the inner type display device and the outer type display device.

Embodiments of the present disclosure are not limited to the above-mentioned embodiments, and other embodiments, which are not mentioned above, can be clearly understood by those skilled in the art from the following descriptions.

Other detailed matters of the example embodiments are included in the detailed description and the drawings.

The benefits and advantages according to the present disclosure are not limited to the contents exemplified above, and additional benefits and advantages are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
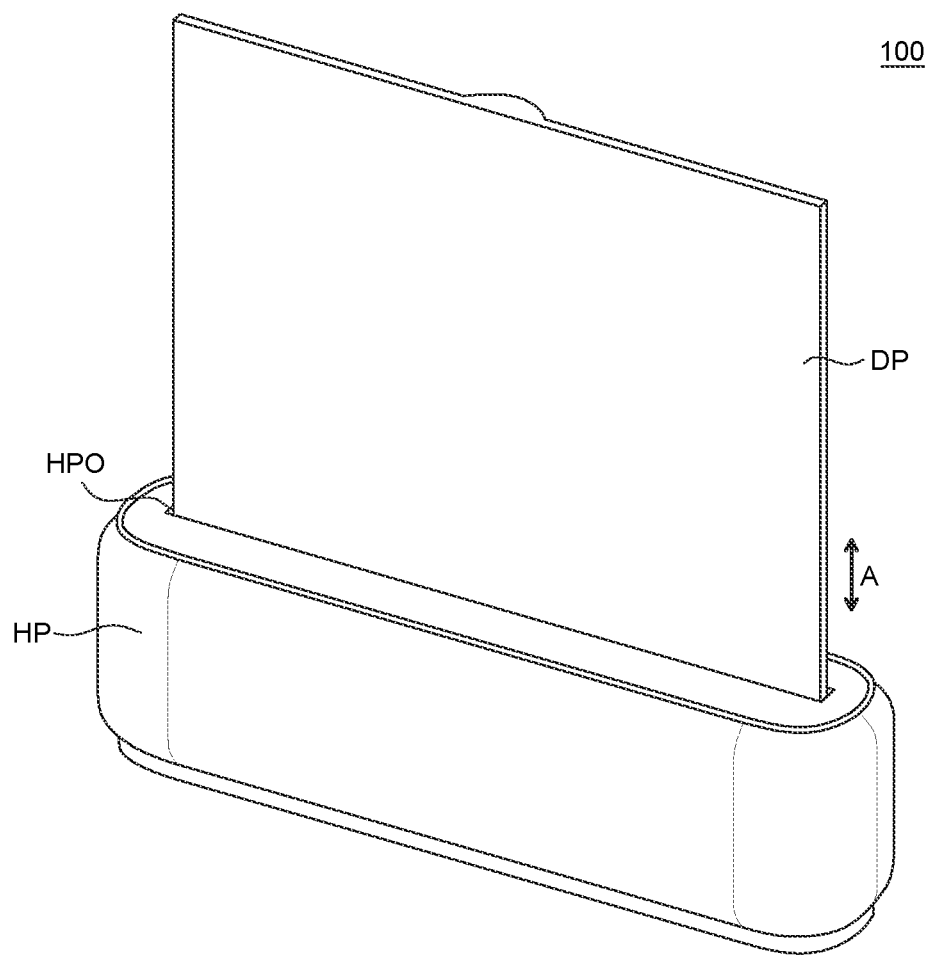
FIGS. 1A and 1B are perspective views of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely adhered to or combined with each other and can be interlocked and operated in technically various ways, and the embodiments can be carried out independently of or in association with each other.

Hereinafter, a rollable display device according to example embodiments of the present disclosure will be described in detail with reference to accompanying drawings.

Rollable Display Device

A rollable display device may be referred to as a display device which is capable of displaying images even though the display device is rolled. The rollable display device may have a high flexibility as compared with a general display device of the related art. A shape of the rollable display device may freely vary and may be selected based on whether the rollable display device is in use, or not. Specifically, when the rollable display device is not used, the rollable display device is rolled to be stored with a reduced volume. In contrast, when the rollable display device is used, the rolled rollable display device is unrolled to be used.

Figure 1B:
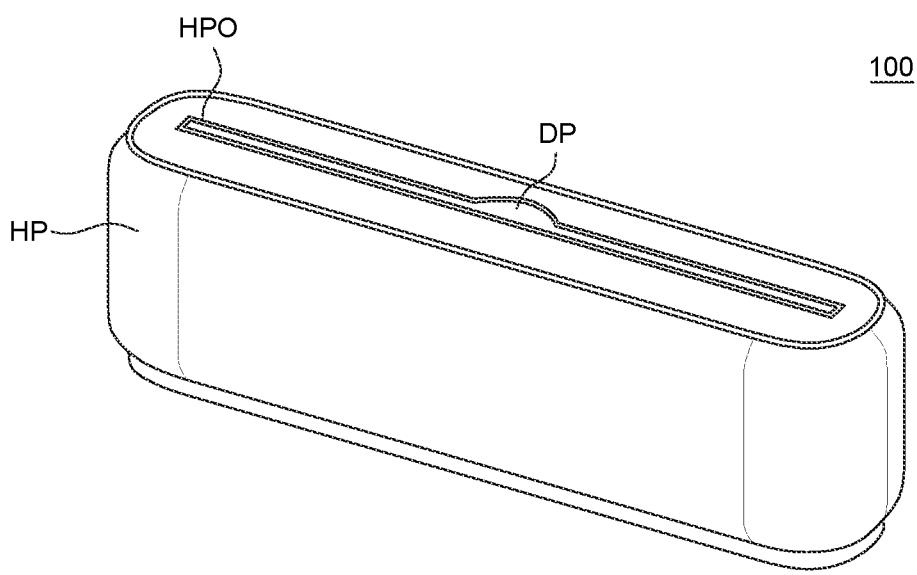

FIGS. 1A and 1B are perspective views of a 100 display device according to an example embodiment of the present disclosure.

First, referring to FIGS. 1A and 1B, the display device 100 includes a display unit DP (which may also be referred to herein as a display DP) and a housing unit HP (which may also be referred to herein as a housing HP).

The display unit DP is a configuration for displaying images to a user and for example, in the display unit DP, a display element and a circuit, a wiring line, and a component for driving the display element may be disposed. In this case, since the display device 100 according to the example embodiment of the present disclosure is a rollable display device 100, the display unit DP may be configured to be wound or unwound. For example, the display unit DP may be formed of a display panel and a plurality of back bars each having flexibility to be wound or unwound. The display unit DP will be described below in more detail with reference to FIGS. 2 to 4B.

The housing unit HP is a case in which the display unit DP is accommodated. The display unit DP may be wound to be accommodated in the housing unit HP and the display unit DP may be unwound to be disposed at the outside of the housing unit HP.

The housing unit HP has an opening HPO through which the display unit DP moves to the inside and the outside of the housing unit HP. The display unit DP may move in a vertical direction by passing through the opening HPO of the housing unit HP, as generally indicated by arrow A in FIG. 1A.

In the meantime, the display unit DP of the display device 100 may be switched from a fully unwound state to a fully wound state or from a fully wound state to a fully unwound state, or selected to be in a position between the fully wound state and the fully unwound state.

FIG. 1A illustrates the display unit DP of the display device 100 fully unwound. In the fully unwound state, the display unit DP of the display device 100 is disposed outside of the housing unit HP. That is, the fully unwound state may correspond to a state in which a user can watch images on the display device 100 with the display unit DP being unwound to be disposed at the outside of the housing unit HP as much as possible such that the display unit DP cannot be further unwound any more.

FIG. 1B illustrates the display unit DP of the display device 100 fully wound. In the fully wound state, the display unit DP of the display device 100 is accommodated in the housing unit HP and cannot be further wound. That is, when the user does not watch the images on the display device 100, it is advantageous from the viewpoint of an outer appearance that the display unit DP is not disposed at the outside of the housing unit HP. Therefore, the fully wound state may correspond to the display unit DP being wound to be completely accommodated in the housing unit HP. Further, when the display unit DP is in a fully wound state to be accommodated in the housing unit HP, a volume of the display device 100 is reduced and the display device 100 may be easily carried.

Display Unit

Figure 2:
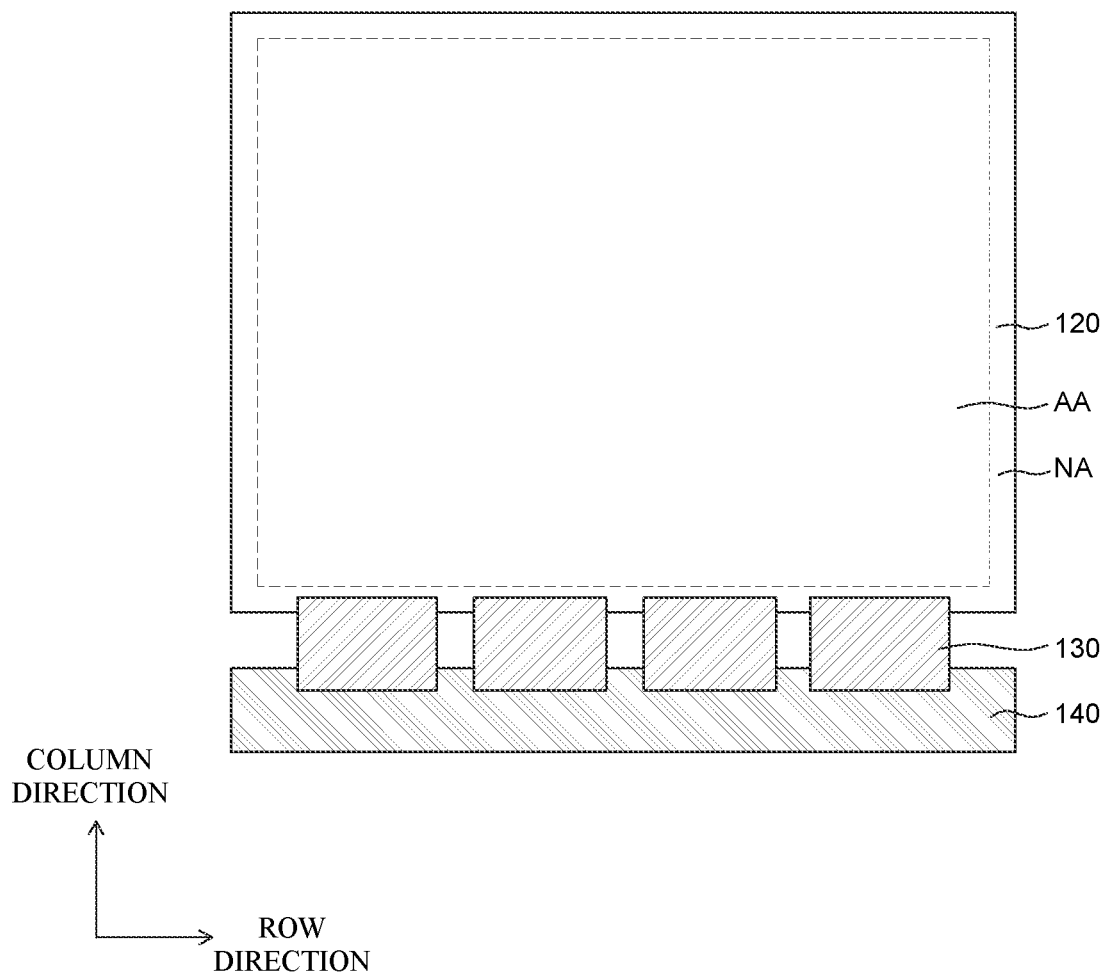
FIG. 2 is a front elevational view of a display of the display device of FIG. 1A
Figure 3:
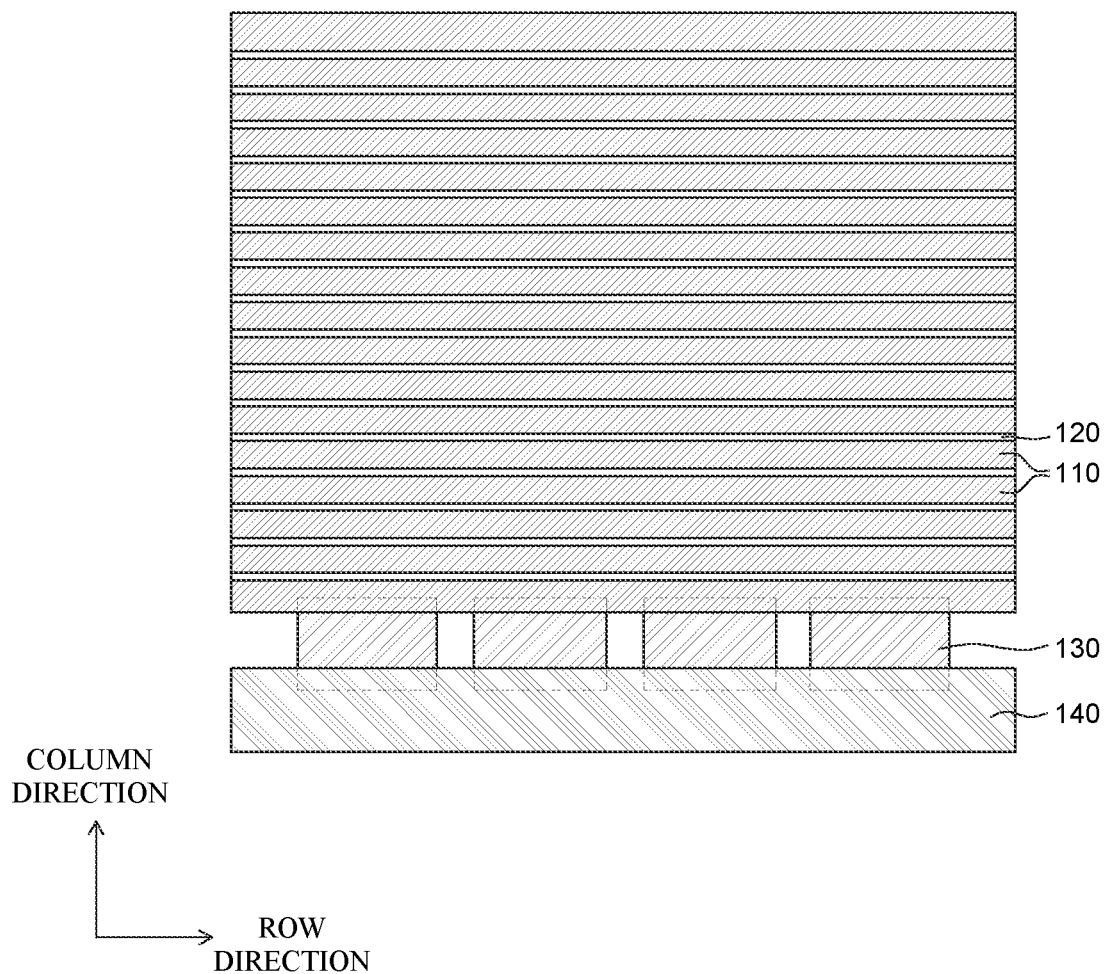
FIG. 3 is a rear elevational view of the display of the display device of FIG. 1A.

FIG. 2 is a plan view of the display unit DP of the display device 100 according to an example embodiment of the present disclosure. FIG. 3 is a rear view of the display unit DP of the display device 100 according to an example embodiment of the present disclosure. Referring to FIGS. 2 and 3, the display unit DP of the display device 100 includes a plurality of back bars 110, a display panel 120, a flexible film 130, and a printed circuit board 140.

The display panel 120 is a panel for displaying images to a user. The display panel 120 may include a display element which displays images, a driving element which drives the display element, and wiring lines which transmit various signals to the display element and the driving element.

The display element may be defined in different ways depending on a type of the display panel 120. For example, when the display panel 120 is an organic light emitting display panel, the display element may be an organic light emitting diode which includes an anode, an organic light emitting layer, and a cathode. For example, when the display panel 120 is a liquid crystal display panel, the display element may be a liquid crystal display element. When the display panel 120 is a light emitting display panel including an LED, the display element may be an LED. Hereinafter, even though the display panel 120 is assumed as an organic light emitting display panel, the display panel 120 is not limited to the organic light emitting display panel. Further, since the display device 100 according to one or more example embodiments of the present disclosure is a rollable display device, the display panel 120 may be implemented as a flexible display panel to be wound around or unwound from the roller unit described elsewhere.

Referring to FIG. 2, the display panel 120 includes an active area AA and a non-active area NA.

The active area AA is an area where images are displayed in the display panel 120. In the active area AA, a plurality of sub pixels which configures the plurality of pixels and a driving circuit for driving the plurality of sub pixels may be disposed. The plurality of sub pixels may be minimum units which configure the active area AA and a display element may be disposed in each of the plurality of sub pixels. For example, an organic light emitting diode which includes an anode, an organic light emitting layer, and a cathode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, and a data line, but is not limited thereto.

The non-active area NA is an area where no image is displayed. The non-active area NA is disposed so as to enclose an outer periphery of the active area AA. In the non-active area NA, various wiring lines and circuits for driving the organic light emitting diode of the active area AA are disposed. For example, in the non-active area NA, a link line which transmits signals to the plurality of sub pixels and circuits of the active area AA or a driving IC such as a gate driver IC or a data driver IC may be disposed, but it is not limited thereto.

The flexible film 130 is a film in which various components are disposed on a base film having a malleability. The flexible film 130 has a malleability so that a partial area thereof may be wound around or unwound from the roller unit together with the display unit DP. The flexible film 130 supplies a signal to the plurality of sub pixels and the circuits of the active area AA and may be electrically connected to the display panel 120. The flexible film 130 is disposed at one end of the non-active area NA of the display panel 120 to supply a power voltage or a data voltage to the plurality of sub pixels and the circuits of the active area AA. The number of flexible films 130 illustrated in FIG. 2 is illustrative and the number of flexible films 130 may vary depending on the design, and is not limited to the number shown in FIG. 2.

In the meantime, for example, a driving IC such as a gate driver IC or a data driver IC may also be disposed on the flexible film 130. The driving IC is a component which processes data for displaying images and a driving signal for processing the data. The driving IC may be disposed by a chip on glass (COG), a chip on film (COF), or a tape carrier package (TCP) technique depending on a mounting method. However, for the convenience of description, it is assume that the driving IC is mounted on the flexible film 130 by a chip on film manner, but the present disclosure is not limited thereto.

The printed circuit board 140 is disposed at one end of the flexible film 130, such as a bottom end in some non-limiting examples, and connected to the flexible film 130. The printed circuit board 140 is a component which supplies signals to the driving IC. The printed circuit board 140 supplies various signals such as a driving signal or a data signal to the driving IC. Various components may be disposed on the printed circuit board 140. For example, a timing controller and a power source unit (or power source) may be disposed on the printed circuit board 140. Even though one printed circuit board 140 is illustrated in FIG. 2, the number of printed circuit boards 140 may vary depending on the design and is not limited thereto.

Even though not illustrated in FIG. 2, an additional printed circuit board which is connected to the printed circuit board 140 may be further disposed in the display device 100. For example, the printed circuit board 140 may be referred to as a source printed circuit board S-PCB on which the data driver is mounted and the additional printed circuit board connected to the printed circuit board 140 may be referred to as a control printed circuit board C-PCB on which a timing controller is mounted. The additional printed circuit board may be disposed in the roller unit or disposed in the housing unit HP at the outside of the roller unit.

Referring to FIG. 3, the plurality of back bars 110 may be disposed on a rear surface of the display panel 120. The plurality of back bars 110 may support the display panel 120 and when the display panel 120 is wound around or unwound from the roller unit, a supporting force of the back bars 110 supports the display panel 120 and may suppress the scratches and damages of the display panel 120. The plurality of back bars 110 may also be referred to as aprons. The plurality of back bars 110 may be formed of a plastic material, but is not limited thereto. In the meantime, the plurality of back bars 110 may be adhered to the display panel 120 by a separate adhesive layer or a foam tape, among other adhesives, fasteners, glues, and the like.

Even though in FIGS. 2 and 3, it is illustrated that the plurality of back bars 110 is disposed on the rear surface of the display panel 120, a back cover having a plurality of openings may be additionally disposed between the display panel 120 and the plurality of back bars 110. Further, only the back cover may be used without using the plurality of back bars 110 in some embodiments.

Coupling Structure of Display Unit and Roller Assembly

Figure 4A:
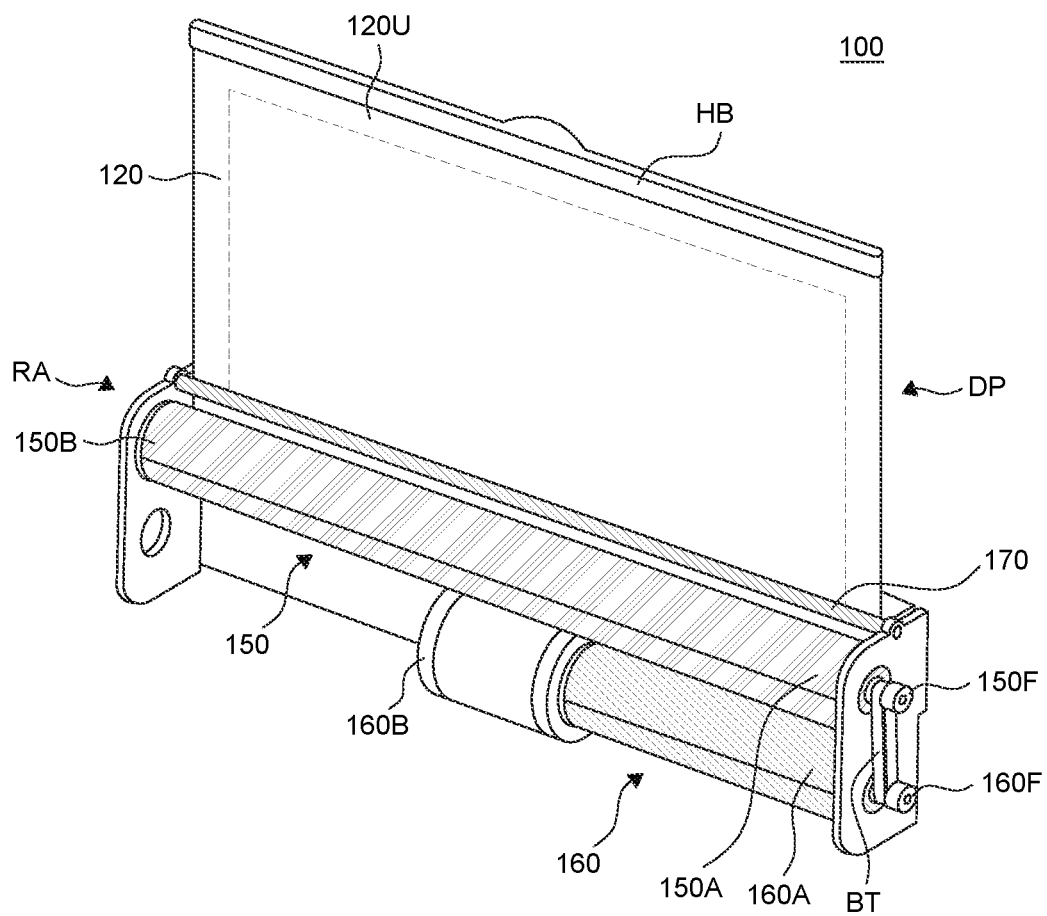
FIG. 4A is a front perspective view of a roller assembly of the display device of FIG. 1A.
Figure 4B:
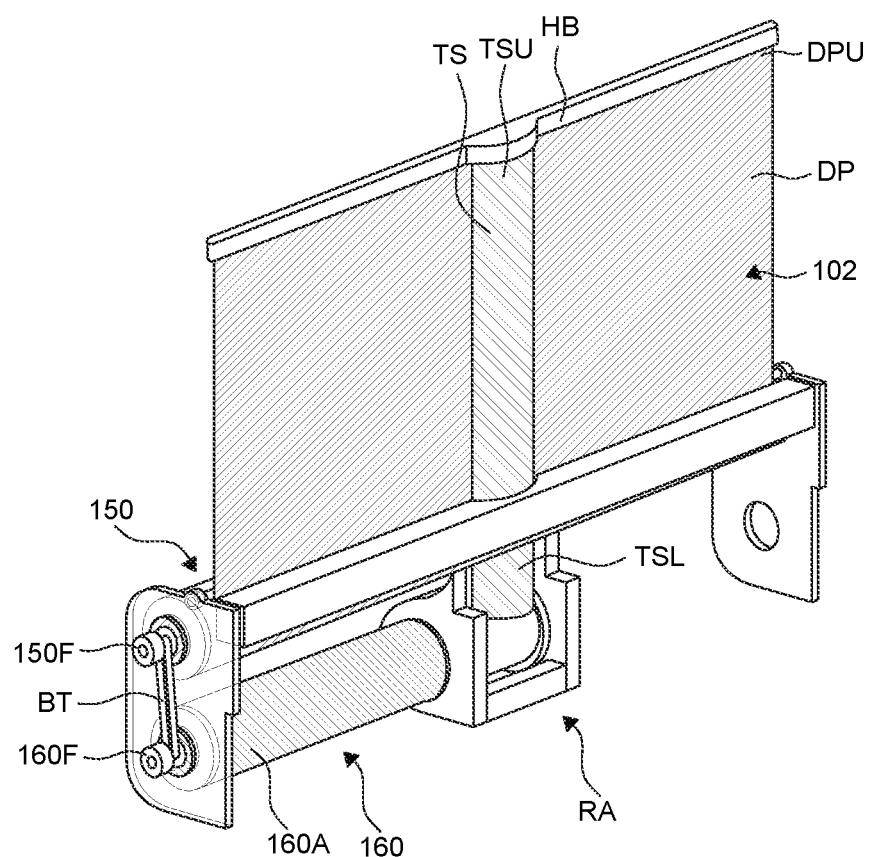
FIG. 4B is a rear perspective view of the roller assembly of the display device of FIG. 1A.

FIG. 4A is a front perspective view of a roller assembly RA of the display device 100 according to at least one embodiment of the present disclosure. FIG. 4B is a rear perspective view of the roller assembly RA of the display device 100. FIGS. 4A and 4B are perspective views for explaining a coupling structure of the display unit DP and the roller assembly RA. The roller assembly RA may include a tape spring TS, a first roller 150, and a second roller 160 of the display device 100 according to one or more embodiments of the present disclosure.

Referring to FIGS. 4A and 4B, the display device 100 according to the one or more embodiments of the present disclosure includes the display unit DP, and a roller assembly RA coupled to the display unit DP that may include a tape spring TS, a first roller 150, a second roller 160, and the display device 100 also includes a head bar HB.

Referring to FIGS. 4A and 4B, the first roller 150 is disposed above the second roller 160. The display unit DP is connected to the first roller 150 and the first roller 150 is configured to wind or unwind the display unit DP.

The tape spring TS is connected to the second roller 160 and is configured to lift the display panel 120 of the display unit DP in response to the driving of the second roller 160.

The tape spring TS is disposed on a rear surface 102 of the display unit DP. An upper end TSU of the tape spring TS is fixed to the head bar HB with the head bar HB disposed at an upper end 120U of the display panel 120 and coupled to the upper end 120U of the display panel 120. A lower end TSL of the tape spring TS is fixed to the second roller 160. Therefore, the tape spring TS may be wound around or unwound from the second roller 160 and move the display unit DP in a vertical direction in response to the driving of the second roller 160.

The tape spring TS may be a bistable reeled composite (BRC) member. The tape spring TS is stretched or bent in a row direction, that is, a width direction of the tape spring TS to be wound or unwound in a column direction, that is, a length direction of the tape spring TS. When the tape spring TS maintains a flat state in a row direction, the tape spring TS is wound in the column direction. In contrast, when the tape spring TS maintains in a bent state in a row direction, the tape spring TS has a rigidity in the column direction to be unwound in the length direction. In other words, the tape spring TS has a curved shape in the unrolled configuration shown at least in FIG. 4B that provides rigidity to the display unit DP. As the tape spring TS is wound about the second roller 160, the tape spring TS flattens to assist with the roller. As the tape spring TS is unwound again, elastic properties of the tape spring TS return the tape spring TS to the curved shape to provide rigidity, as in FIG. 4B.

In an embodiment, the rigidity of the tape spring TS in the column direction is related to a degree of bending of the tape spring TS in the row direction. That is, the degree of bending the tape spring TS in the row direction may be appropriately selected according to a rigidity that is beneficial for the display unit DP in the column direction.

In the display device 100 according to one or more embodiments of the disclosure, an operation of stretching or bending the tape spring TS in the row direction is performed to induce the tape spring TS to be wound or unwound in the column direction, as noted above. Specifically, during the winding operation of the second roller 160, the tape spring TS is wound in the column direction, while also flattening in the row direction (i.e., width direction) to be wound around the second roller 160 in a flat state, and during the unwinding operation of the second roller 160, the tape spring is stretched in the column direction to be unwound from the second roller 160.

During the unwinding operation of the second roller 160, the tape spring TS which is stretched in the column direction has a rigidity in the column direction so that the rocking and twisting of the unwound display panel 120 may be restrained. Therefore, as long as another external force is not applied, the unwound display panel 120 may maintain the flat state due to the rigidity of the tape spring TS.

The head bar HB may be disposed on an uppermost end DPU of the display unit DP. The head bar HB is disposed so as to fix the display unit DP and the upper end TSU of the tape spring TS. The head bar HB covers only a part of a surface which is adjacent to an uppermost edge of the display unit DP in some embodiments, so as not to hide an image displayed on the front surface of the display unit DP shown in FIG. 4A. For example, the display unit DP and the head bar HB may be fixed by a screw, but the disclosure is not limited thereto.

In the meantime, in the display device 100 according to the one or more embodiments of the present disclosure, a first fastening unit 150F (which may be referred to herein as a first fastener 150F) may be disposed on one end 150A (i.e., a first end 150A) of the first roller 150 and a second fastening unit 160F may be disposed on one end 160A (i.e., a first end 160A) of the second roller 160. The first fastening unit 150F and the second fastening unit 160F are connected to a timing belt BT to be synchronized. Therefore, the timing belt BT allows the first roller 150 and the second roller 160 to rotate in the same direction at the same speed in some embodiments (i.e., the first and second rollers 150, 160 rotate simultaneously with each other in some embodiments). A second end 150B of the first roller 150 opposite to the first end 150A of the first roller 150 and a second end 160B of the second roller 160 opposite to the first end 160A of the second roller 160 may each omit the first fastening units 150F, 160F, respectively, and the timing belt BT in some embodiments.

The first fastening unit 150F and the second fastening unit 160F may be configured with a belt pulley structure. Therefore, when the second fastening unit 160F rotates, the timing belt BT connected to the second fastening unit 160F also rotates and the first fastening unit 150F connected to the timing belt BT may rotate in the same direction as the second fastening unit 160F. Accordingly, in the display device 100 according to some embodiments of the present disclosure, the timing belt BT may rotate the first roller 150 and the second roller 160 in the same direction. Moreover, each of the first fastening units 150F, 160F may have a similar configuration (such as at least the same diameter), to result in a direct power or torque transfer between the first and second rollers 150, 160 to rotate the first and second rollers 150, 160 at the same speed. Other configurations are possible and contemplated herein, including drive devices configured to rotate the first and second rollers 150, 160 at the same speed and in the same direction without fastening units and timing belts, as well as other timing belt configurations, such as a configuration with a different structure, or fastening units that change the torque applied from one roller to the other.

Hereinafter, a specific configuration of the first roller 150 according to at least some embodiments of the present disclosure will be described with reference to FIGS. 5A to 5C.

First Roller

Figure 5A:
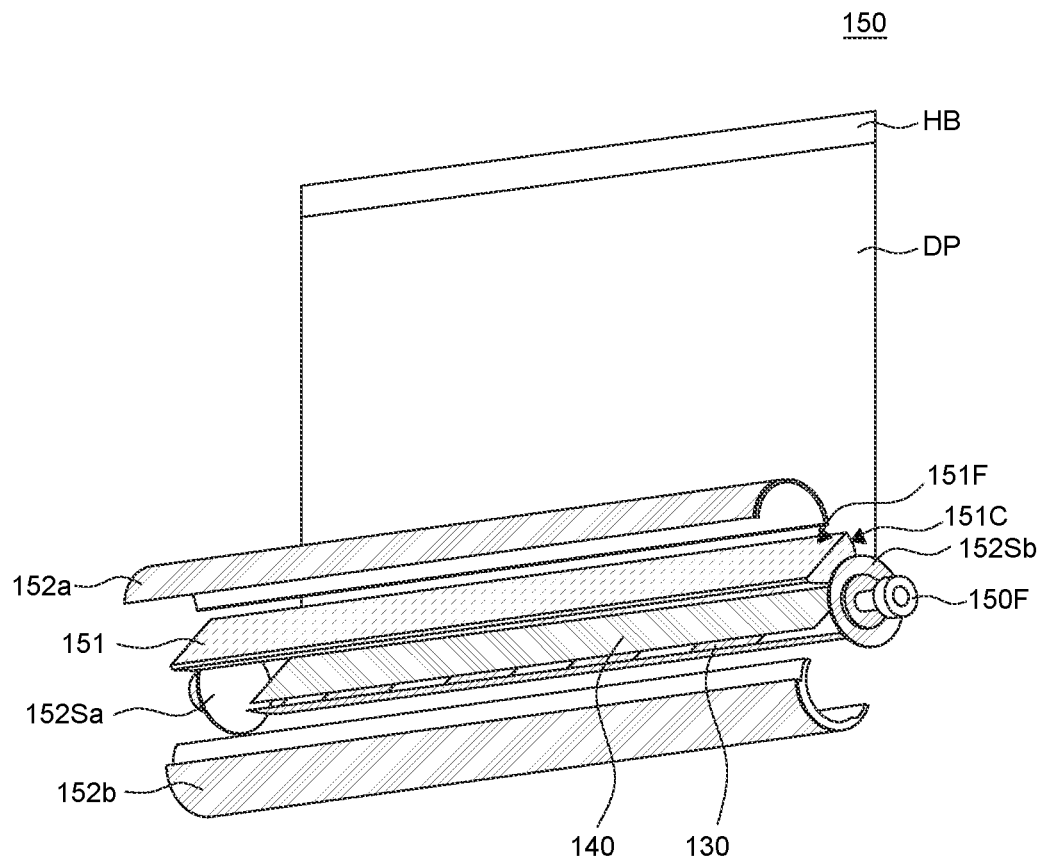
FIG. 5A is an exploded perspective view of a first roller of the roller assembly of the display device of FIG. 4A.

FIG. 5A is an exploded perspective view of the first roller 150 of the roller assembly RA of the display device 100 according to one or more embodiments of the present disclosure. FIG. 5B is a perspective view of the first roller 150 of the display device 100 in an assembled state according to at least some embodiments of the present disclosure. FIG. 5C is a cross-sectional view of the first roller of the display device 100 according to some embodiments of the present disclosure.

Figure 5B:
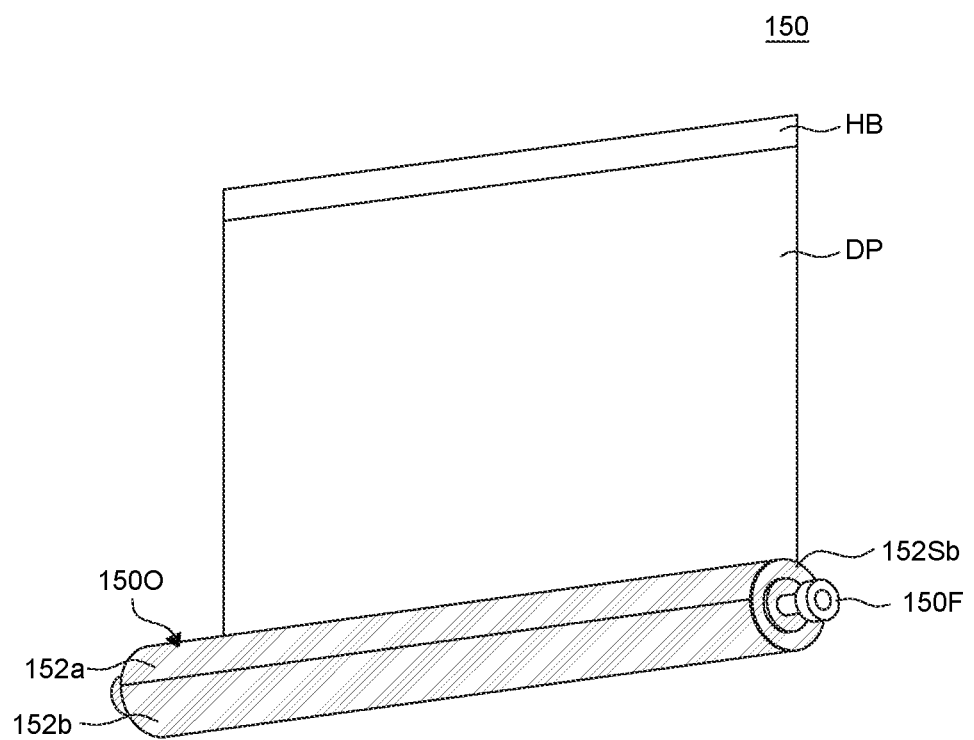
FIG. 5B is a perspective view of the first roller of the display device of FIG. 5A in an assembled state.
Figure 5C:
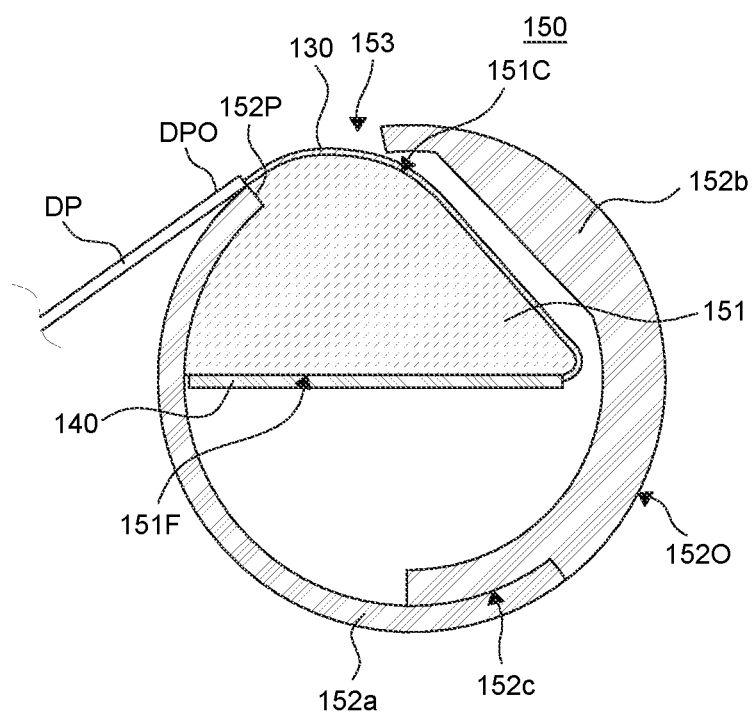
FIG. 5C is a cross-sectional view of the first roller of the display device of FIG. 5B.

Referring to FIGS. 5A to 5C, the first roller 150 is connected to the display unit DP, and more specifically to the display panel 120 (FIG. 4A). Therefore, the display panel 120 may be wound around or unwound from the first roller 150. Specifically, referring to FIG. 5C, in the first roller 150, at least a part of the flexible circuit film 130 and the printed circuit board 140 may be accommodated internal to the first roller 150 so that the display panel 120 or the display unit DP, or both, may be connected to the first roller 150.

Referring to FIGS. 5A to 5C, the first roller 150 may include a substrate support unit 151 (which may also be referred to herein as a substrate support 151 or a support 151), a plurality of cases 152, and the first fastening unit 150F.

The substrate support unit 151 may include a flat portion 151F in the first roller 150 on which the printed circuit board 140 is seated and may be configured to guide the flexible circuit film 130 from the inside of the first roller 150 to the outside of the first roller 150. That is, as illustrated in FIGS. 5A and 5C, the substrate support unit 151 may include the flat portion 151F on which the flexible circuit film 130 is seated and a curved portion 151C on which the flexible circuit film 130 is disposed. In an embodiment, the flat portion 151F is a flat and planar outer surface 151F of the substrate support unit 151 and the curved portion 151C is a curved outer surface 151C of the substrate support unit 151 that is integral with, and connected to, the flat and planar outer surface 151F.

The plurality of cases 152 is configured to accommodate the substrate support unit 151. The plurality of cases 152 is disposed to have a cylindrical shape as a whole so that the display panel 120 may be wound or unwound on an outer circumferential surface 152O of the plurality of cases 152.

The plurality of cases 152 may be separable into a first case 152a and a second case 152b as illustrated in FIGS. 5A to 5C.

In the meantime, a plurality of case sides 152Sa and 152Sb may be further disposed on both sides of the plurality of cases 152. The plurality of case sides 152Sa and 152Sb may be configured to fix the plurality of cases 152 and the substrate support unit 151, but is not limited thereto.

The plurality of case sides 152Sa and 152Sb may include a first side 152Sa and a second side 152Sb opposite to the first side 152Sa. In an embodiment, and referring to FIGS. 5A and 5B, the first fastening unit 150F of the first roller 150 may be disposed in the second side 152Sb, but the position of the first fastening unit 150F is not limited thereto.

Referring back to FIG. 4A, and with continuing reference to FIGS. 5A to 5C, a panel guide roller 170 may be disposed above the first roller 150. The panel guide roller 170 is disposed to be adjacent to the display panel 120 (or display unit DP) to apply a tension to the display panel 120 so that when the display panel 120 is wound or unwound, the display panel 120 may be guided to be flat by the panel guide roller 170. In an embodiment, the panel guide roller 170 is in direct contact with the display unit DP and offset relative to the first roller 150.

As shown in FIG. 5C, the plurality of cases 152 may include the first case 152a overlapping the second case 152b with a portion of the first case 152a received in a channel, notch, or groove 152c in the second case 152b to provide the outer circumferential surface 152O of the plurality of cases 152 with a consistent radius of curvature before, at, and after an interface between the first case 152a and the second case 152b. Moreover, the plurality of cases 152 may have an opening 153 through which the plurality of flexible films 130 are inserted to enable the display unit DP to be wound or unwound from the outer circumferential surface 152O of the plurality of cases 152, while the plurality of flexible films 130 and the printed circuit board 140 are supported by the substrate support unit 151 and protected internal to the first roller 150 by the plurality of cases 152. In an embodiment, an outer peripheral edge 152P of the plurality of cases 152 is aligned with an outer peripheral edge DPO of the display unit DP such that the display unit DP does not enter the plurality of cases 152, but rather, wraps around the outer circumferential surface 152O of the plurality of cases during the winding and unwinding operations.

Hereinafter, a specific configuration of the second roller 160 according to one or more embodiments of the present disclosure will be described with reference to FIGS. 6A to 7B.

Second Roller

Figure 6A:
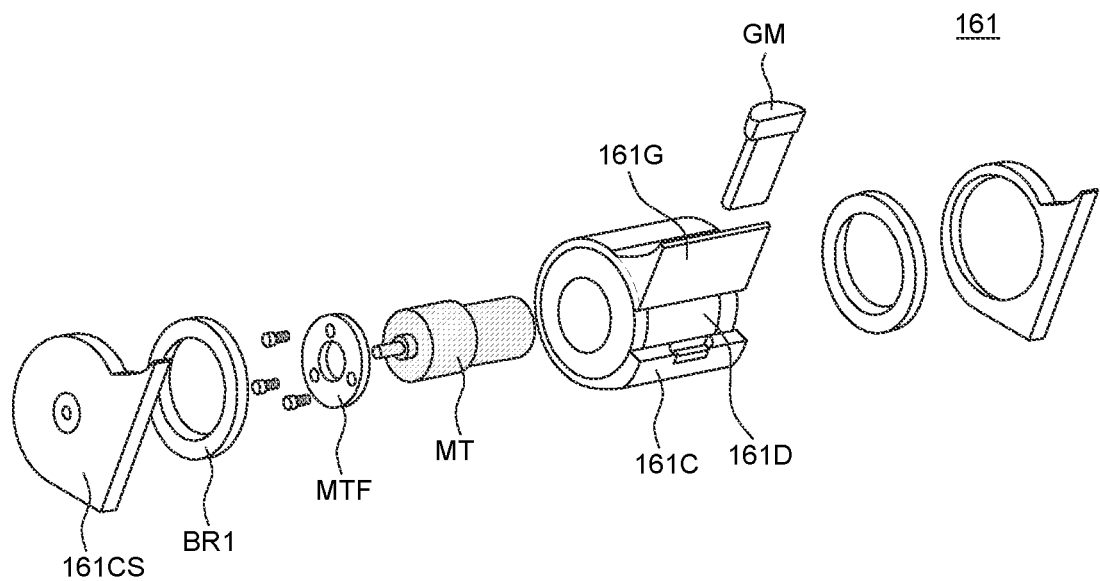
FIG. 6A is an exploded perspective view of a first part of a second roller of the roller assembly of the display device of FIG. 4A.
Figure 6B:
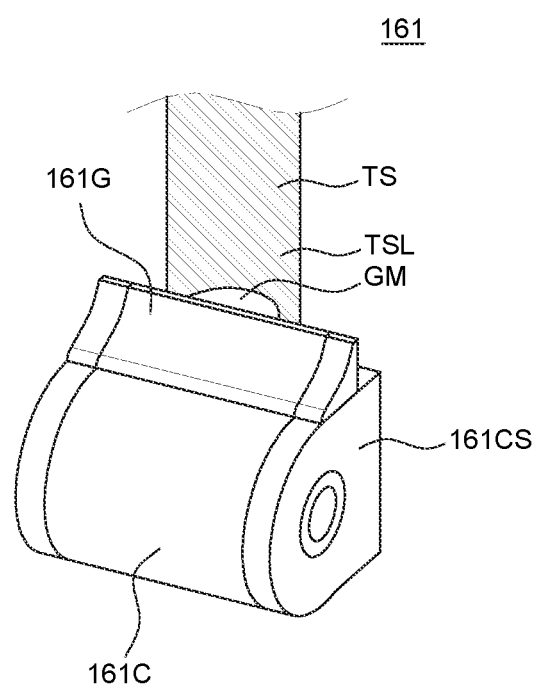
FIG. 6B is a perspective view of the first part of the second roller of the display device of FIG. 6A in an assembled state.
Figure 7A:
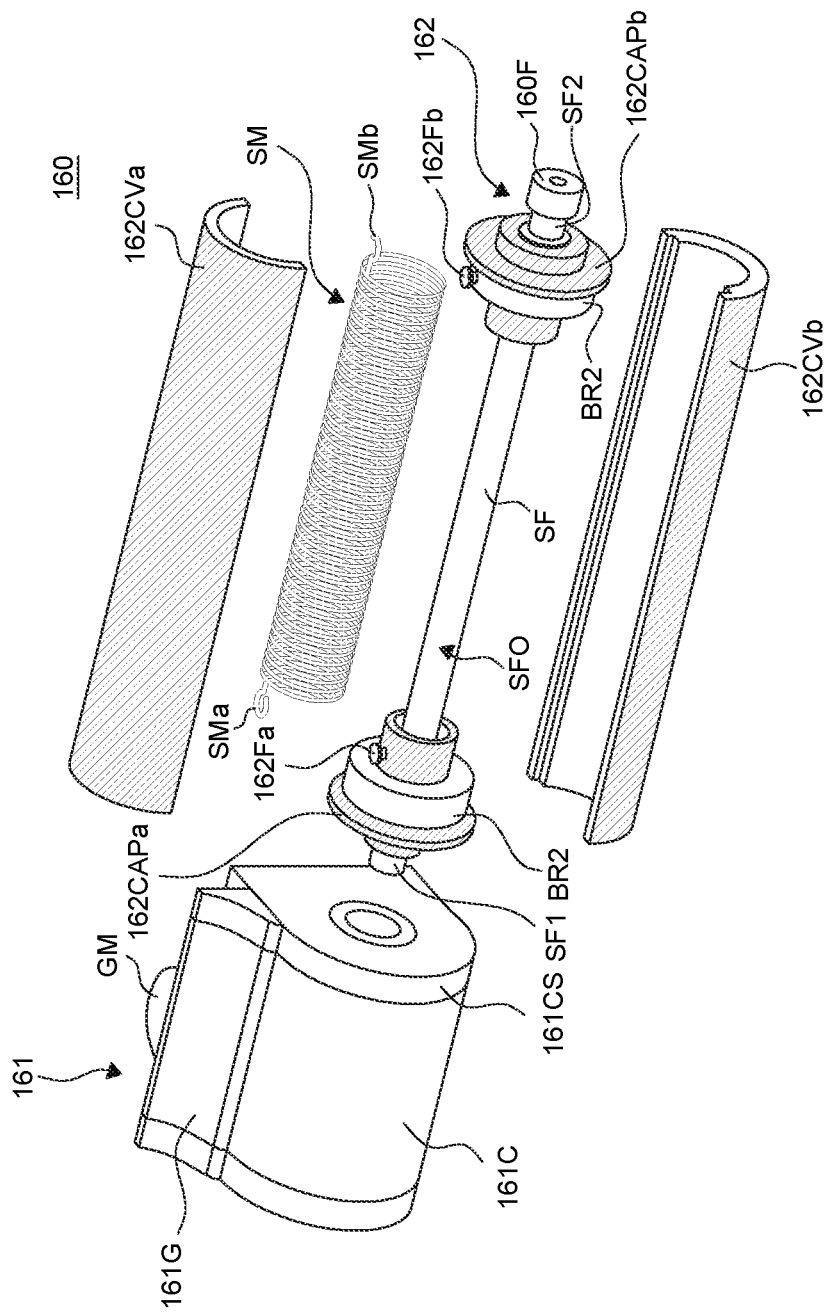
FIGS. 7A and 7B are exploded perspective views of the second roller of the display device of FIG. 4A.
Figure 7B:
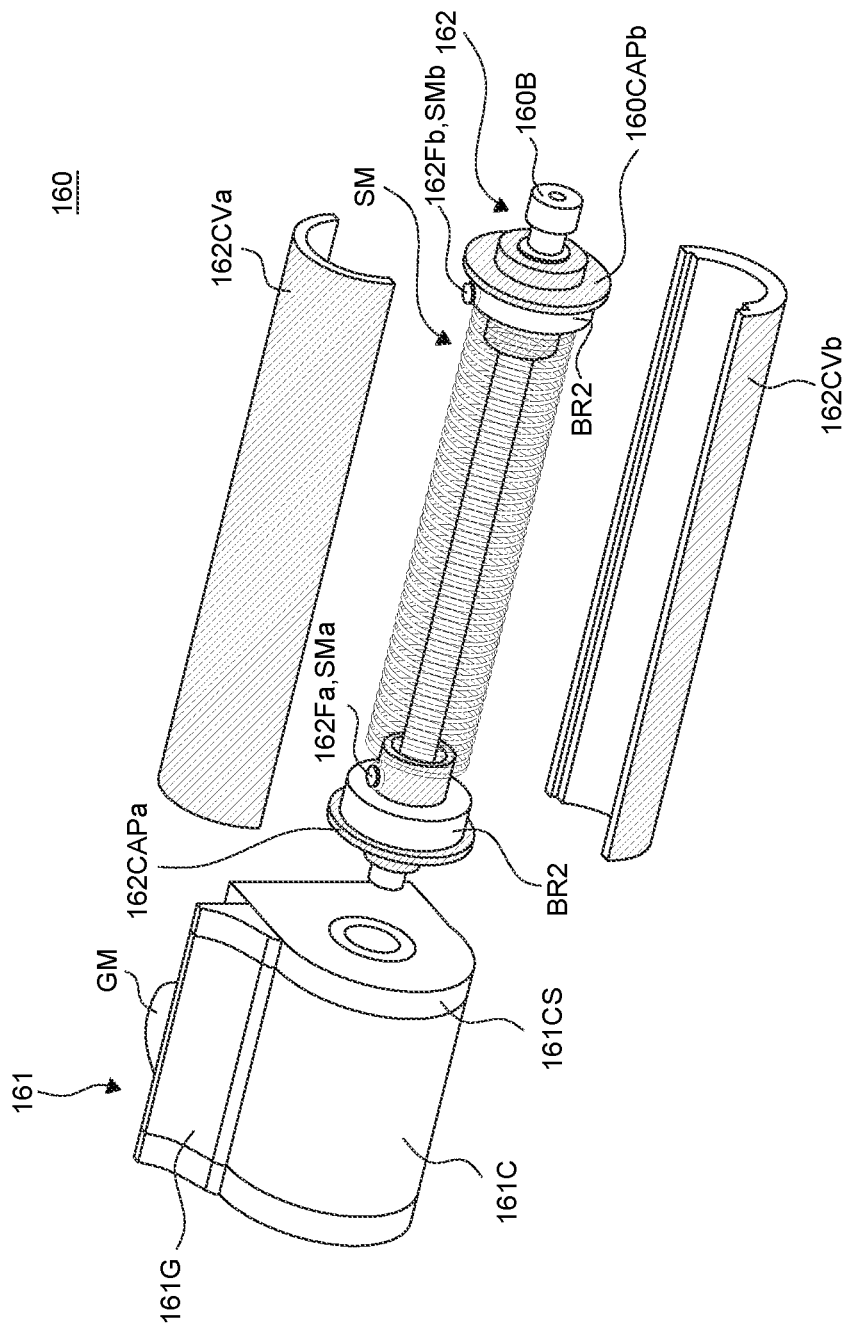

FIG. 6A is an exploded perspective view of a first part 161 of the second roller 160 of the display device 100 according to one or more embodiments of the present disclosure. FIG. 6B is a perspective view of the first part 161 of the second roller 160 of the display device 100 in an assembled state according to one or more embodiments of the present disclosure. FIGS. 7A and 7B are exploded perspective views of the second roller 160 of the display device 100 according to one or more embodiments of the present disclosure.

Referring to FIGS. 6A to 7B, the second roller 160 includes the first part 161 and a second part 162.

The first part 161 may include a motor MT, a motor fixture MTF (which may also be referred to herein as a motor fastener or a motor fastening plate), a tape spring drum 161D, a tape spring case 161C, a tape spring side case 161CS, a plurality of tape spring guides 161G, a plurality of first bearings BR1, and a guide member GM.

The motor MT may be disposed at a center portion which is an innermost side of the second roller 160. In an embodiment, the motor MT is received internal to the first part 161 of the second roller 160. The motor MT may rotate the second roller 160 in a clockwise direction or a counterclockwise direction. The motor MT is connected to a power source unit (or power source), such as a separate external power source or a built-in battery, to be supplied with the power for operating the second roller 160 and the first roller 150 via timing belt BT.

The tape spring drum 161D may have a cylindrical shape and may accommodate the motor MT. The tape spring drum 161D may also be connected to the motor MT. Specifically, the tape spring drum 161D, as illustrated in FIG. 6A, is disposed on one side surface of the tape spring drum 161D to cover the motor MT and may be connected to the motor MT by means of the motor fix MTF which is disposed so as to fix the motor MT to the tape spring drum 161D. Therefore, the tape spring drum 161D may rotate in a clockwise direction or a counterclockwise direction in accordance with the operation of the motor MT.

One end of the tape spring TS, such as the lower end TSL of the tape spring TS, is fixed to the tape spring drum 161D. The tape spring TS is fixed to the tape spring drum 161D and may be wound around or unwound from the tape spring drum 161D as the tape spring drum 161D rotates in a clockwise direction or a counterclockwise direction via the motor MT. That is, the tape spring drum 161D may be configured to wind or unwind the tape spring TS.

The tape spring case 161C may be configured to accommodate the tape spring drum 161D and the tape spring TS, meaning the tape spring drum 161D and the tape spring TS are received inside the tape spring case 161C. Specifically, the tape spring case 161C may be disposed so as to enclose at least a majority of the outer circumferential surface of the tape spring drum 161D. The tape spring case 161C may have a shape to allow the tape spring TS to be wound around or unwound from the tape spring drum 161D. For example, even though the tape spring case 161C may have a cylindrical shape having a C-shaped cross-section as illustrated in FIGS. 6A and 6B, the tape spring case 161C may have a partially open shape (i.e., a cylindrical or circular shape with an opening) through which the tape spring TS passes, but is not limited thereto.

The tape spring case 161C may be configured so as not to directly rotate by the operation of the motor MT. For example, the tape spring case 161C may be fixed to the inside of the housing unit HP so that even though the tape spring drum 161D accommodated in the tape spring case 161C rotates by the operation of the motor MT, the tape spring case 161C may not rotate.

Referring to FIGS. 6A and 6B, a plurality of tape spring case sides 161CS may be disposed on both sides of the tape spring case 161C. That is, the plurality of tape spring case sides 161CS may include a first tape spring case side 161CSa and a second tape spring case side 161CSb coupled to opposite sides of the tape spring case 161C. The tape spring case side 161CS may cover side surfaces of the motor MT accommodated in the tape spring case 161C and the side surface of the tape spring drum 161D. Therefore, the plurality of tape spring case sides 161CS may be configured to more stably accommodate the motor MT and the tape spring drum 161D in the tape spring case 161C. In an embodiment, the tape spring case 161C and the plurality of tape spring case sides 161CS may be configured to be separable, as illustrated in FIGS. 6A and 6B, but may also be configured to be integrated, but is not limited thereto.

The tape spring guide 161G may be disposed in the tape spring case 161C. The tape spring guide 161G may be connected to the tape spring case 161C in a position corresponding to a position of the tape spring TS accommodated in the tape spring case 161C. The tape spring guide 161G may be disposed such that a thickness is gradually reduced in a lifting direction of the display unit DP. In an embodiment, the tape spring guide 161G has a tapered shape from a base or bottom toward a top of the tape spring guide 161G. Therefore, the tape spring guide 161G guides the tape spring TS to be wound or unwound and specifically, may minimize the rocking of the tape spring TS when the tape spring TS is wound or unwound.

The plurality of first bearings BR1 may be disposed between both sides of the tape spring drum 161D and the plurality of tape spring case sides 161CS. Therefore, the plurality of first bearings BR1 may support both sides of the tape spring drum 161D so that the tape spring drum 161D rotates around the tape spring case 161C. In an embodiment, the plurality of first bearings BR1 include ball bearings, such as radial or ring ball bearings.

The guide member GM may be further disposed in the tape spring case 161C. The guide member GM may be connected to the tape spring case 161C in a position corresponding to a position of the tape spring TS accommodated in the tape spring case 161C. The guide member GM may be disposed to have a curved surface corresponding to a curved surface of the tape spring TS. Therefore, the guide member GM may guide the tape spring TS accommodated in the tape spring case 161C to be wound or unwound. Additional features of the first part 161 of the second roller 160 are described in U.S. patent application Ser. No. 17/977,305 filed on Oct. 31, 2022, in the U.S. Patent Office, the entire contents of which are incorporated herein by reference. Referring to FIGS. 7A and 7B, the second part 162 of the second roller 160 may include a shaft SF, a spring member SM (which may also be referred to herein as a spring SM), a plurality of second bearings BR2, a plurality of cover units 162CV (which may also be referred to herein as a plurality of covers 162CV), and a plurality of caps 162CAP.

The shaft SF may be configured to have the same rotation axis as a rotation axis of the second roller 160. One end SF1 (i.e., a first end SF1) of the shaft SF is connected to the motor MT and the other end SF2 (i.e., a second end SF2) may be connected to the timing belt BT (FIG. 4A). That is, the second fastening unit 160F described above may be disposed on the other end SF2 of the shaft SF such that the other end SF2 is coupled to the timing belt BT (FIG. 4A).

The plurality of caps 162CAP may be disposed on both ends SF1, SF2 of the shaft SF. The plurality of caps 162CAP may have a circular or cylindrical shape so as to correspond to a cylindrical shape of the second roller 160.

The plurality of caps 162CAP may include a first cap 162CAPa disposed at the one end SF1 of the shaft SF and a second cap 162CAPb disposed at the other end SF2 of the shaft SF. In an embodiment, a first fixing unit 162Fa (which may also be referred to herein as a first fastener 162Fa) may be disposed in the first cap 162CAPa and coupled to one end SMa (i.e., a first end SMa) of the spring member SM. The spring member SM and the one end SMa of the spring member SM will be described in further detail below.

The plurality of second bearings BR2 may be disposed in the plurality of caps 162CAP. In other words, the second bearings BR2 may be configured to be accommodated in the plurality of caps 162CAP. A second fixing unit 162Fb (which may also be referred to herein as a second fastener 162Fb) may be disposed in one of the second bearings BR2 and coupled to the other end SMb (i.e., a second end SMb) of the spring member SM. The spring member SM and the other end SMb of the spring member SM will be described in further detail below.

The spring member SM may be disposed so as to enclose an outer circumferential surface SFO of the shaft SF. One end SMa of the spring member SM is connected to the shaft SF, which is connected to the motor MT, and the other end SMb of the spring member SM is connected to one cap 162CAP among the plurality of caps 162CAP, such as to the second cap 162CAPb in a non-limiting example.

Specifically, the one end SMa of the spring member SM is connected to the one end SF1 of the shaft SF, which is connected to the motor MT, and the one end SMa of the spring member SM is also attached to the first fixing unit 162Fa disposed in the first cap 162CAPa. The other end SMb of the spring member SM is connected to the second fixing unit 162Fb, which is disposed in the second bearing BR2 of the second cap 162CAPb. Therefore, one end SMa of the spring member SM rotates at the same speed as the motor MT and the other end SMb of the spring member SM may rotate by the second bearing BR2. Other configurations are contemplated herein, such as both ends SMa of the spring member SM being attached to respective motors.

The plurality of cover units 162CV is disposed so as to accommodate the spring member SM, the shaft SF, the plurality of second bearings BR2, and the plurality of caps 162CAP inside the cover units 162CV. The plurality of cover units 162CV may have a cylindrical shape.

The plurality of cover units 162CV may include a first cover 162CVa and a second cover 162CVb, with the second cover 162CVb having a seating groove configured to be connected to the first cover 162CVa. In an embodiment, the seating groove is similar to the channel 152C of the plurality of cases of the first roller 150.

Figure 8:
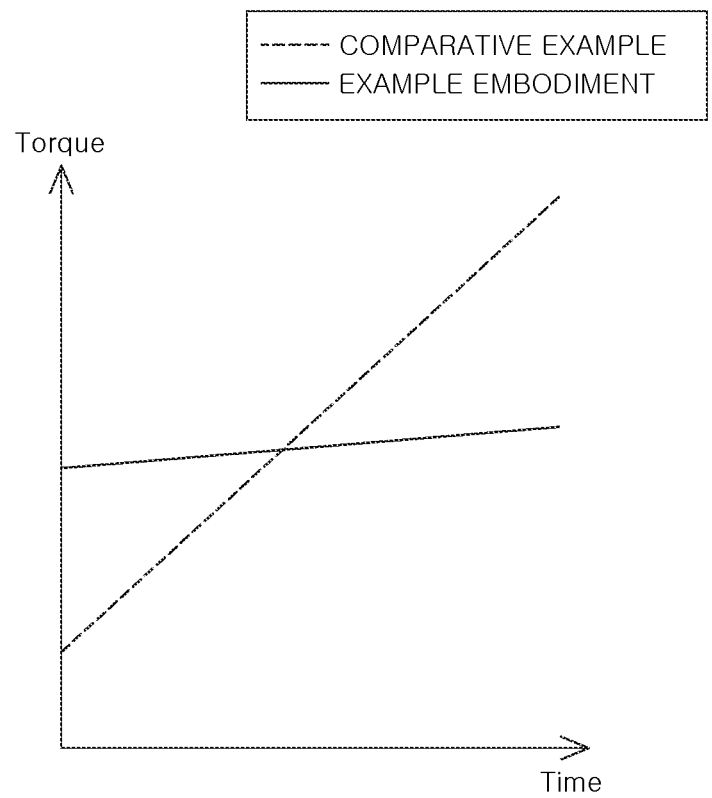
FIG. 8 is a graphical representation of a torque applied to the display panel during winding of display devices according to embodiments of the present disclosure relative to a comparative example.

Hereinafter, a specific unwinding operation of the display device 100 according to at least some embodiments of the disclosure will be described with reference to FIG. 8.
Unwinding of Display Device FIG. 8 is a graphical representation of a torque applied to the display panel 120 (FIG. 4A) when the display device 100 according to one or more embodiments of the present disclosure is wound. In FIG. 8, the X axis is a Time taken until the display device 100 is fully unwound and a Y axis is a magnitude of a torque applied to the display panel 120 as the display device 100 is fully unwound.

In the display device 100 according to the embodiments of the present disclosure, one end SMa of the spring member SM of the second roller 160 rotates at the same speed as the motor and the other end SMb of the spring member SM rotates by the second bearing BR2 and rotation of the one end SMa. Therefore, when the display device 100 is wound or unwound, a tension of the spring member SM applied to the display panel 120 may be substantially constantly maintained with a very small deviation in some embodiments.

Referring to FIG. 8, in the display device of the related art according to Comparative Example, both ends of the display panel are fixed so that a magnitude of the tension applied to the display panel when the display device is unwound is gradually increased. Accordingly, as the stress applied to the display panel is concentrated, an excessive tension is generated in the display panel, which increases the likelihood of damage to the display panel.

Therefore, in the display device 100 according to the embodiments of the present disclosure, one end SMa of the spring member SM rotates at the same speed as the motor MT and the other end SMb of the spring member SM rotates by the second bearing BR2 and rotation of the one end SMa. That is, one of both ends of the spring member SM is not fixed, but is configured to freely rotate. Therefore, an energy stored in the spring member SM may maintain a predetermined level and a tension of the spring member SM applied to the display panel 120 may be constantly maintained. More specifically, as the motor MT beings to rotate, the one end SMa of the spring member SM will begin to rotate and store energy in the spring member SM. Once the stored energy in the spring member SM reaches a minimum threshold level for rotation of the other end SMb of the spring member SM (i.e., at least an amount of force to overcome friction associated with rotation of the other end SMb), the other end SMb of the spring member SM will begin to rotate and release the stored energy (i.e., tension) in the spring member SM. Accordingly, in the display device 100 according to the embodiments of the present disclosure, one end SMa of the spring member SM of the second roller 160 rotates at the same speed as the motor MT and the other end SMb of the spring member SM is configured to rotate by the second bearing BR to maintain a consistent level of energy stored in the spring member SM and apply a constant or relatively constant tension to the display panel 120 during winding and unwinding operations. Therefore, when the display device 100 is wound or unwound, a tension of the spring member SM applied to the display panel 100 may be substantially constantly maintained. Accordingly, when the display device 100 is unwound, a torque of the spring member SM is concentrated and maintained relatively constant so that excessive tension generated in the display panel 120 may be minimized.

In the meantime, the tape spring TS is synchronized with the motor MT so that a rising speed of the tape spring TS maintains a constant value together with the rotation speed of the motor MT. Further, the second roller 160 is connected to the motor MT, which is synchronized with the tape spring TS to have the same rotation speed as the rotation speed of the motor MT. However, as the display panel 120 is unwound from the first roller 150, a radius of a cylindrical shape formed by the first roller 150 and the display panel 120 together is gradually reduced so that the rotation speed of the first roller 150 may be increased during the process of unwinding the display panel 120. Therefore, the rotation speed of the first roller 150 is preferably different from the rotation speed of the second roller 160, but the first roller 150 and the second roller 160 are connected by the timing belt BT. As a result, the actual rotation speed of the first roller 150 may be the same as the rotation speed of the second roller 160. In an embodiment, the second roller 160 is not directly connected to the motor MT, but the shaft SF is directly connected to the motor MT so that there may be a rotation angle difference between the shaft SF and the second roller 160. Therefore, as illustrated in FIG. 8, a torque of the spring member SM may increase over time as a result of the rollers 150, 160 generally moving at the same speed, and offset from the speed of the shaft SF based on the rotation angle difference between the shaft SF and the second roller 160. However, FIG. 8 illustrates that an amount of increased torque of the spring member SM due to the above is very small, such that generation of excessive tension in the display panel 120 may be minimized. Further, as noted above, the other end SMb of the spring member SM is configured to rotate and release tension in the spring member SM, which further helps alleviate rapidly increasing torque as in the Comparative Example. In the meantime, in the display device 100 according to the example embodiments of the present disclosure, the first roller 150 and the second roller 160 may be synchronized. Therefore, the same mechanism may be applied to both the inner type display device and the outer type display device. Here, the inner type display device refers to a type of display where a surface of the display panel 120 on which an image is displayed faces the roller during the winding and the outer type display device refers to the opposite, namely a type of display where a surface of the display panel 120 on which an image is displayed faces an opposite direction of the roller or away from the roller during the winding.

Specifically, in the display device 100 according to the example embodiments of the present disclosure, the first fastening unit 150F and the second fastening unit 160F of the first roller 150 and the second roller 160 may be connected to the timing belt BT. Therefore, the first roller 150 and the second roller 160 may rotate in the same direction by the timing belt BT, that is, the first roller 150 and the second roller 160 may be synchronized. Therefore, regardless whether the display device 100 is an inner type display device or an outer type display device, the same mechanism may be applied. Accordingly, in the display device 100 according to the example embodiment of the present disclosure, the first roller 150 and the second roller 160 may be synchronized. Therefore, the same mechanism may be applied to both the inner type display device and the outer type display device so that the display device 100 has a structure with a wider range of applicability for different types of display devices.

Figure 9:
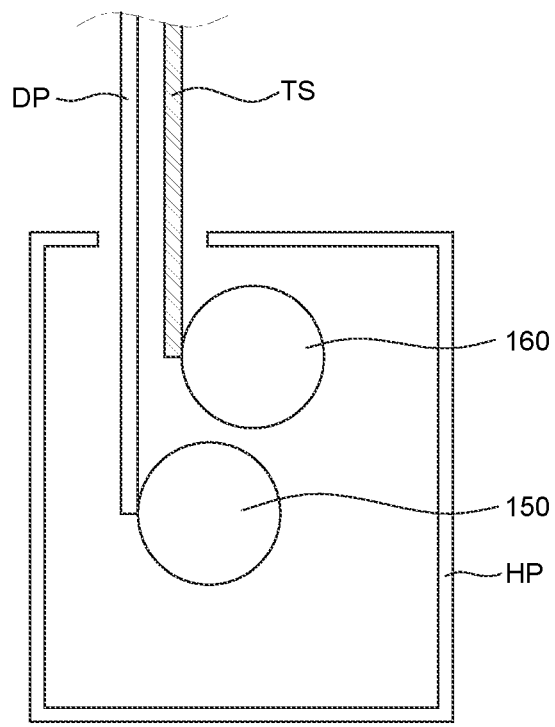
FIG. 9 is a cross-sectional view of a display device according to an example embodiment of the present disclosure.

FIG. 9 is a cross-sectional view of a display device 900 according to one or more example embodiments of the present disclosure. The display device 900 of FIG. 9 may be similar to the display device 100 of FIGS. 1A to 8, except for a placement structure of the first roller 150 and the second roller 160, and as otherwise described below. Redundant description of common features between the display devices 100, 900 will be omitted.

Referring to FIG. 9, in the display device 900 according to example embodiments of the present disclosure, the first roller 150 may be disposed below the second roller 160.

In the display device 900, the first roller 150 and the second roller 160 disposed above the first roller 150 may be synchronized. Therefore, the same mechanism may be applied to both the inner type display device and the outer type display device.

Specifically, in the display device 900, the first fastening unit 150F and the second fastening unit 160F of the first roller 150 and the second roller 160 may be connected to the timing belt BT. Therefore, the first roller 150 and the second roller 160 may rotate in the same direction by the timing belt BT, that is, the first roller 150 and the second roller 160 may be synchronized. Therefore, regardless whether the display device 900 is an inner type display device or an outer type display device, the same mechanism may be applied. Accordingly, in the display device 900 according to example embodiments of the present disclosure, the first roller 150 and the second roller 160 may be synchronized. Therefore, the same mechanism may be applied to both the inner type display device and the outer type display device so that the display device 900 with an easily changeable design of the structure may be provided. As a result, the configuration of the rollers 150, 160 is not limited to the examples provided with respect to FIGS. 1A to 8 where the first roller 150 is above the second roller 150, and may also include the second roller 160 above the first roller 150.

Figure 10:
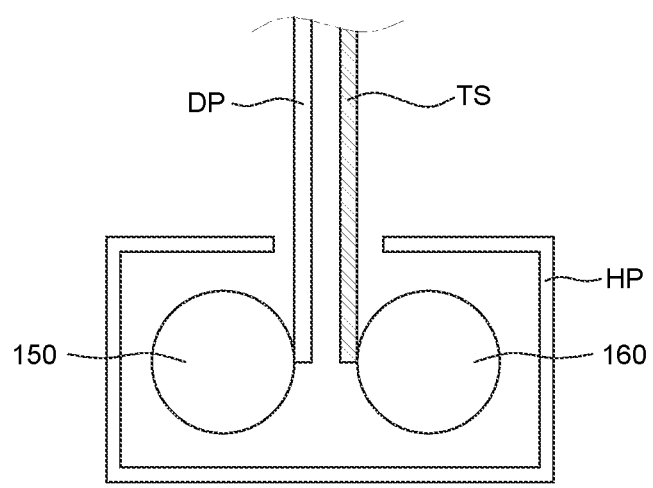
FIG. 10 is a cross-sectional view of a display device according to an example embodiment of the present disclosure.

FIG. 10 is a cross-sectional view of a display device 1000 according to example embodiments of the present disclosure. The display device 1000 of FIG. 10 may be similar to the display device 100 of FIGS. 1A to 8, except for a placement structure of the first roller 150 and the second roller 160, and as otherwise described below. Redundant description of common features between the display devices 100, 1000 will be omitted.

Referring to FIG. 10, in the display device 1000 according to example embodiments of the present disclosure, the first roller 150 may be disposed on a side portion of the second roller 160, or in other words, the first roller 150 is disposed in front of or behind the second roller 160 with the rollers 150, 160 generally aligned on the same horizontal plane.

In the display device 1000 according to example embodiments of the present disclosure, the first roller 150 and the second roller 160 disposed on the side portion of the first roller 150 may be synchronized. Therefore, the same mechanism may be applied to both the inner type display device and the outer type display device.

Specifically, in the display device 1000 according to still another example embodiment of the present disclosure, the first fastening unit 150F and the second fastening unit 160F of the first roller 150 and the second roller 160 may be connected to the timing belt BT. Therefore, the first roller 150 and the second roller 160 rotate in the same direction by the timing belt BT, that is, the first roller 150 and the second roller 160 may be synchronized. Therefore, regardless whether the display device 1000 is an inner type display device or an outer type display device, the same mechanism may be applied. Accordingly, in the display device 1000 according to another example embodiment of the present disclosure, the first roller 150 and the second roller 160 may be synchronized. Therefore, the same mechanism may be applied to both the inner type display device and the outer type display device so that the display device 1000 with an easily changeable design of the structure may be provided. Accordingly, the present disclosure is not limited to the specific configuration of the rollers 150, 160, but rather, contemplates any arrangement of the rollers 150, 160 with respect to each other.

The example embodiments of the present disclosure can also be described as follows:

According to an aspect of the present disclosure, a display device includes a display panel in which an image is displayed; a tape spring which is connected to the display panel to lift the display panel; a first roller on which the display panel is wound or unwound; a second roller on which the tape spring is wound or unwound; and a timing belt which rotates the second roller in the same direction as the first roller when the first roller is wound or unwound.

The display device may further comprise a motor which rotates the second roller; and a tape spring drum which accommodates the motor, the tape spring being wound around or unwound from the tape spring drum.

The second roller may be disposed on one side of the tape spring drum.

The display device may further comprise a spring member which is disposed in the second roller and is connected to the motor through one end.

The second roller may include a shaft having one end connected to the motor and the other end connected to the timing belt; a plurality of caps which accommodates a bearing and is disposed on both ends of the shaft; and a cover unit which accommodates the spring member, the shaft, and the plurality of caps and has a cylindrical shape.

One end of the spring member may be connected to the shaft to be connected to the motor and the other end of the spring member may be connected to one cap of the plurality of caps.

One end of the spring member may rotate at the same speed as the motor and the other end of the spring member may rotate by the bearing.

The first roller may be disposed below the second roller.

The first roller may be disposed on a side portion of the second roller.

The first roller may be disposed above the second roller.

The display device may further comprise a panel guide roller which is disposed above the first roller to apply a tension to the display panel.

The tape spring drum may further include a tape spring guide which guides the winding or unwinding of the tape spring.

The higher the display unit, may the smaller the thickness of the tape spring guide follows.

The display device may further comprise a printed circuit board which is connected to the display unit to supply a signal to the display unit; and a flexible circuit film which connects the display unit and the printed circuit board.

At least a part of the flexible film and the printed circuit board may be accommodated in the first roller.

In one or more embodiments of the present disclosure, a display device includes: a display panel; a tape spring coupled to the display panel; a roller assembly coupled to the display panel and to the tape spring, the roller assembly including a first roller configured to wind or unwind the display panel, and a second roller separate from the first roller, the second roller configured to wind or unwind the tape spring simultaneously with the winding or unwinding of the display panel.

The roller assembly may further include: a motor configured to rotate the second roller; and a timing belt coupled to the first roller and to the second roller, the timing belt configured to rotate the first roller in a same direction and at a same speed as the second roller.

The display device may further include a panel guide roller disposed above the first roller and configured to apply a tension to the display panel.

The roller assembly may further includes: a motor; and a spring having a first end and a second end, the first end of the spring coupled to the motor and a second end of the spring being freely rotatable to release tension in the spring.

In one or more embodiments of the present disclosure, a display device includes: a display panel; a tape spring coupled to the display panel; a roller assembly coupled to the display panel and to the tape spring, including: a first roller configured to wind or unwind the display panel; and a second roller configured to wind or unwind the tape spring, wherein the second roller includes a spring with a first end and a second end, at least one of the first end and second end being freely rotatable to relieve tension in the spring.

The roller assembly may further include a motor, the first end of the spring being coupled to the motor and the second end of the spring being freely rotatable.

The roller assembly may further include a panel guide roller configured to apply tension to the display panel.

The roller assembly may further include a timing belt coupled to the first roller and to the second roller, the timing belt configured to rotate the second roller in a same direction as the first roller.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a display panel configured to display an image;
   a tape spring connected to the display panel and configured to lift the display panel;
   a first roller on which the display panel is wound or unwound;
   a second roller on which the tape spring is wound or unwound; and
   a timing belt configured to rotate the second roller in a same direction as the first roller in response to the first roller being wound or unwound.

2. The display device according to claim 1, further comprising:
   a motor configured to rotate the second roller; and
   a tape spring drum which accommodates the motor, the tape spring being wound around, or unwound from, the tape spring drum,
   wherein the second roller is disposed on one side of the tape spring drum.

3. The display device according to claim 2, further comprising:
   a spring member disposed in the second roller and connected to the motor at one end of the spring member.

4. The display device according to claim 3, wherein the second roller includes:
   a shaft having one end connected to the motor and an other end connected to the timing belt;
   a plurality of caps disposed on the one end and the other end of the shaft;
   a bearing accommodated in the plurality of caps; and
   a cover which accommodates the spring member, the shaft, and the plurality of caps, the cover having a cylindrical shape,
   the one end of the spring member being connected to the shaft and to the motor, and the other end of the spring member being connected to one cap of the plurality of caps.

5. The display device according to claim 4, wherein the one end of the spring member rotates at the same speed as the motor and the other end of the spring member rotates via the bearing.

6. The display device according to claim 1, wherein the first roller is disposed below the second roller.

7. The display device according to claim 1, wherein the first roller is disposed on a side portion of the second roller.

8. The display device according to claim 1, wherein the first roller is disposed above the second roller.

9. The display device according to claim 1, further comprising:
   a panel guide roller disposed above the first roller and configured to apply a tension to the display panel.

10. The display device according to claim 1, wherein the tape spring drum further includes a tape spring guide configured to guide the winding or unwinding of the tape spring.

11. The display device according to claim 10, wherein a thickness of the tape spring guide decreases over a height of the tape spring guide.

12. The display device according to claim 1, further comprising:
    a printed circuit board connected to the display panel to supply a signal to the display panel; and
    a flexible circuit film which connects the display panel and the printed circuit board,
    wherein at least a part of the flexible film and the printed circuit board are accommodated inside the first roller.

13. A display device, comprising:
    a display panel;
    a tape spring coupled to the display panel and configured to lift the display panel;
    a roller assembly coupled to the display panel and to the tape spring, including:
      a first roller configured to wind or unwind the display panel; and
      a second roller separate from the first roller, the second roller configured to wind or unwind the tape spring simultaneously with the winding or unwinding of the display panel.

14. The display device of claim 13, wherein the roller assembly further includes:
    a motor configured to rotate the second roller; and
    a timing belt coupled to the first roller and to the second roller, the timing belt configured to rotate the first roller in a same direction and at a same speed as the second roller.

15. The display device of claim 13, further comprising:
    a panel guide roller disposed above the first roller and configured to apply a tension to the display panel.

16. The display device of claim 13, wherein the roller assembly includes:
    a motor; and
    a spring having a first end and a second end, the first end of the spring coupled to the motor and a second end of the spring being freely rotatable to release tension in the spring.

17. A display device, comprising:
a display panel;
- a tape spring coupled to the display panel and configured to lift the display panel;
- a roller assembly coupled to the display panel and to the tape spring, including:
  - a first roller configured to wind or unwind the display panel; and
  - a second roller configured to wind or unwind the tape spring,
- wherein the second roller includes a spring with a first end and a second end, at least one of the first end and second end being rotatable to relieve tension in the spring.

18. The display device of claim 17, wherein the roller assembly includes a motor, the first end of the spring being coupled to the motor and the second end of the spring being freely rotatable.

19. The display device of claim 17, wherein the roller assembly further includes a panel guide roller configured to apply tension to the display panel.

20. The display device of claim 17, wherein the roller assembly further includes a timing belt coupled to the first roller and to the second roller, the timing belt configured to rotate the second roller in the a same direction as the first roller.

* * * * *